United States Patent
Nie et al.

(10) Patent No.: US 10,768,252 B2
(45) Date of Patent: Sep. 8, 2020

(54) METHODS AND SYSTEMS FOR SAMPLING K-SPACE DATA IN MAGNETIC RESONANCE IMAGING

(71) Applicant: General Electric Company, Schenectady, NY (US)

(72) Inventors: Lisha Nie, Beijing (CN); Yongchuan Lai, Beijing (CN); Xuan Liu, Beijing (CN)

(73) Assignee: GENERAL ELECTRIC COMPANY, Schenectady, NY (US)

(*) Notice: Subject to any disclaimer, the term of this patent is extended or adjusted under 35 U.S.C. 154(b) by 202 days.

(21) Appl. No.: 16/169,533

(22) Filed: Oct. 24, 2018

(65) Prior Publication Data
US 2020/0132793 A1    Apr. 30, 2020

(51) Int. Cl.
*G01R 33/24* (2006.01)
*G01R 33/48* (2006.01)
*G01R 33/561* (2006.01)

(52) U.S. Cl.
CPC ...... *G01R 33/4824* (2013.01); *G01R 33/5611* (2013.01); *G01R 33/5615* (2013.01)

(58) Field of Classification Search
CPC .. G01R 33/24; G01R 33/543; G01R 33/5608; G01R 33/4828; G01R 33/3415; G01R 33/283; G01R 33/4824; G01R 33/307; G01R 33/5615; G01R 33/32; G01R 33/5611; G01R 33/60; G01V 3/32; E21B 49/08; E21B 2049/085; G01N 24/10
See application file for complete search history.

(56) References Cited

U.S. PATENT DOCUMENTS

| | | | | |
|---|---|---|---|---|
| 8,076,939 B2* | 12/2011 | Setsompop | .......... | G01R 33/246 324/309 |
| 8,436,614 B2* | 5/2013 | Biber | .......... | G01R 33/281 324/318 |
| 2004/0044280 A1* | 3/2004 | Paley | .......... | G01R 33/445 600/410 |
| 2004/0260173 A1* | 12/2004 | Salerno | .......... | G01R 33/56341 600/420 |
| 2011/0210735 A1* | 9/2011 | Trakic | .......... | G01R 33/422 324/309 |
| 2013/0285655 A1* | 10/2013 | Miyazaki | .......... | G01R 33/5608 324/309 |

OTHER PUBLICATIONS

Feinberg, D., "VET Imaging: Magnetic Resonance Imaging with Variable Encoding Time," Magnetic Resonance in Medicine, vol. 38, No. 1, Jul. 1997, 8 pages.

* cited by examiner

*Primary Examiner* — Jermele M Hollington
*Assistant Examiner* — Taqi R Nasir
(74) *Attorney, Agent, or Firm* — McCoy Russell LLP

(57) ABSTRACT

Various methods and systems are provided for acquiring k-space data for magnetic resonance imaging. In one example, after applying a phase encoding gradient, the k-space data of a phase angle is acquired while applying a frequency encoding gradient. An amplitude of the phase encoding gradient and a duration of the phase encoding gradient determined based on each and every of a phase angle of the phase encoding line and a duration of the frequency encoding gradient.

20 Claims, 9 Drawing Sheets

METHODS AND SYSTEMS FOR SAMPLING K-SPACE DATA IN MAGNETIC RESONANCE IMAGING

FIELD

Embodiments of the subject matter disclosed herein relate to data acquisition in magnetic resonance imaging.

BACKGROUND

Magnetic resonance imaging (MRI) is a medical imaging modality that can create images of the inside of a human body without using x-rays or other ionizing radiation. MRI systems include a superconducting magnet to create a strong, uniform, static magnetic field $B_0$. When a human body, or part of a human body, is placed in the magnetic field $B_0$, the nuclear spins associated with the hydrogen nuclei in tissue water become polarized, wherein the magnetic moments associated with these spins become preferentially aligned along the direction of the magnetic field $B_0$, resulting in a small net tissue magnetization along that axis. MRI systems also include gradient coils that produce smaller amplitude, spatially-varying magnetic fields with orthogonal axes to spatially encode the magnetic resonance (MR) signal by creating a signature resonance frequency at each location in the body. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coils and is transformed into the image using reconstruction algorithms.

BRIEF DESCRIPTION

In one embodiment, a method comprises applying a phase encoding gradient corresponding to a phase encoding line in a circular Cartesian k-space, wherein an amplitude and a duration of the phase encoding gradient vary with a position of the phase encoding line in the circular Cartesian k-space; and acquiring k-space data along the phase encoding line in the circular Cartesian k-space by applying a frequency encoding gradient, wherein a duration of the acquiring k-space data varies with the position of the phase encoding line in the k-space. In this way, the power of the phase gradient and the repetition time of the radio frequency pluses during MRI imaging may be reduced.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present disclosure will be better understood from reading the following description of non-limiting embodiments, with reference to the attached drawings, wherein below.

DETAILED DESCRIPTION

Figure 1:
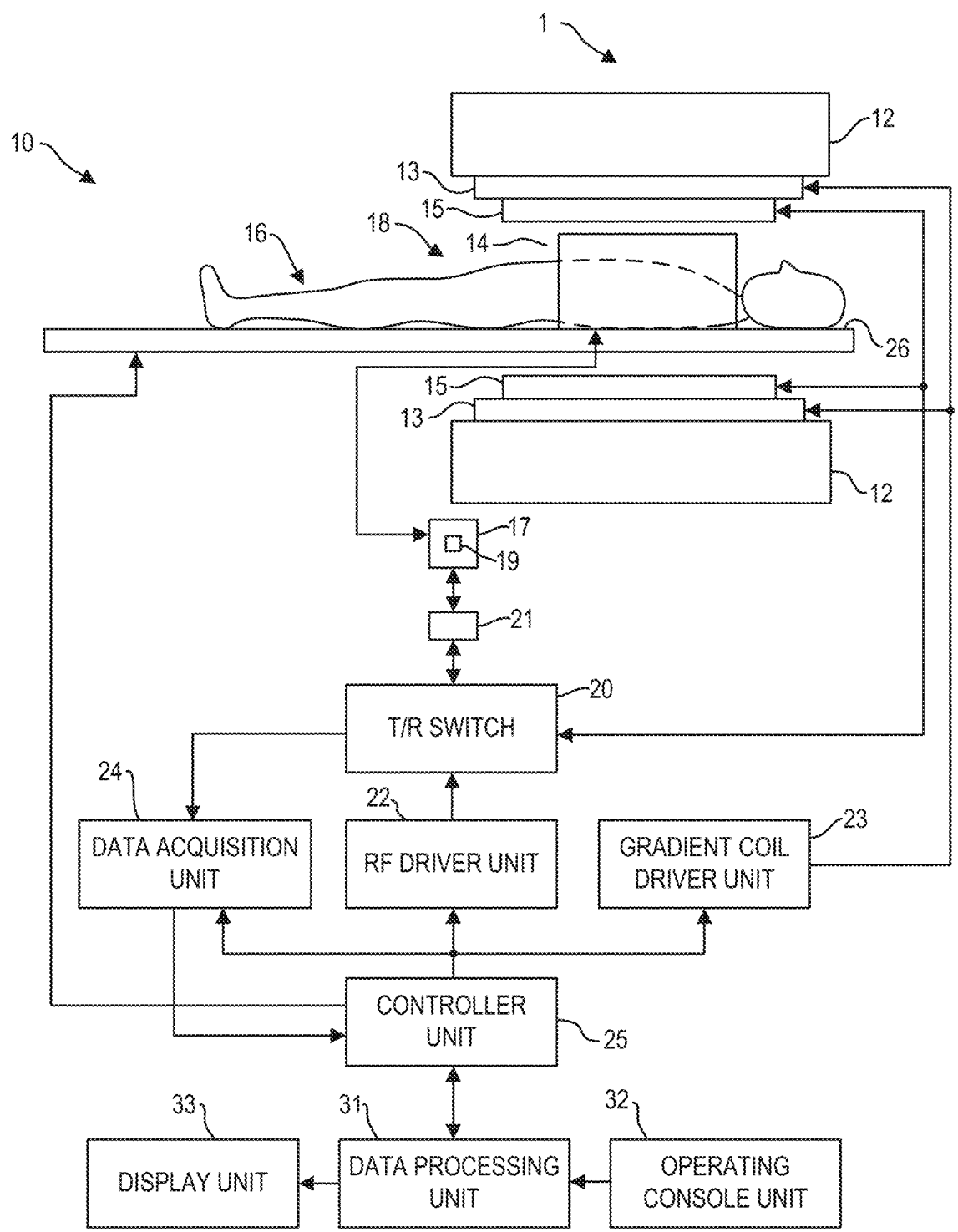
FIG. 1 is a block diagram of an MRI system according to an exemplary embodiment.
Figure 2:
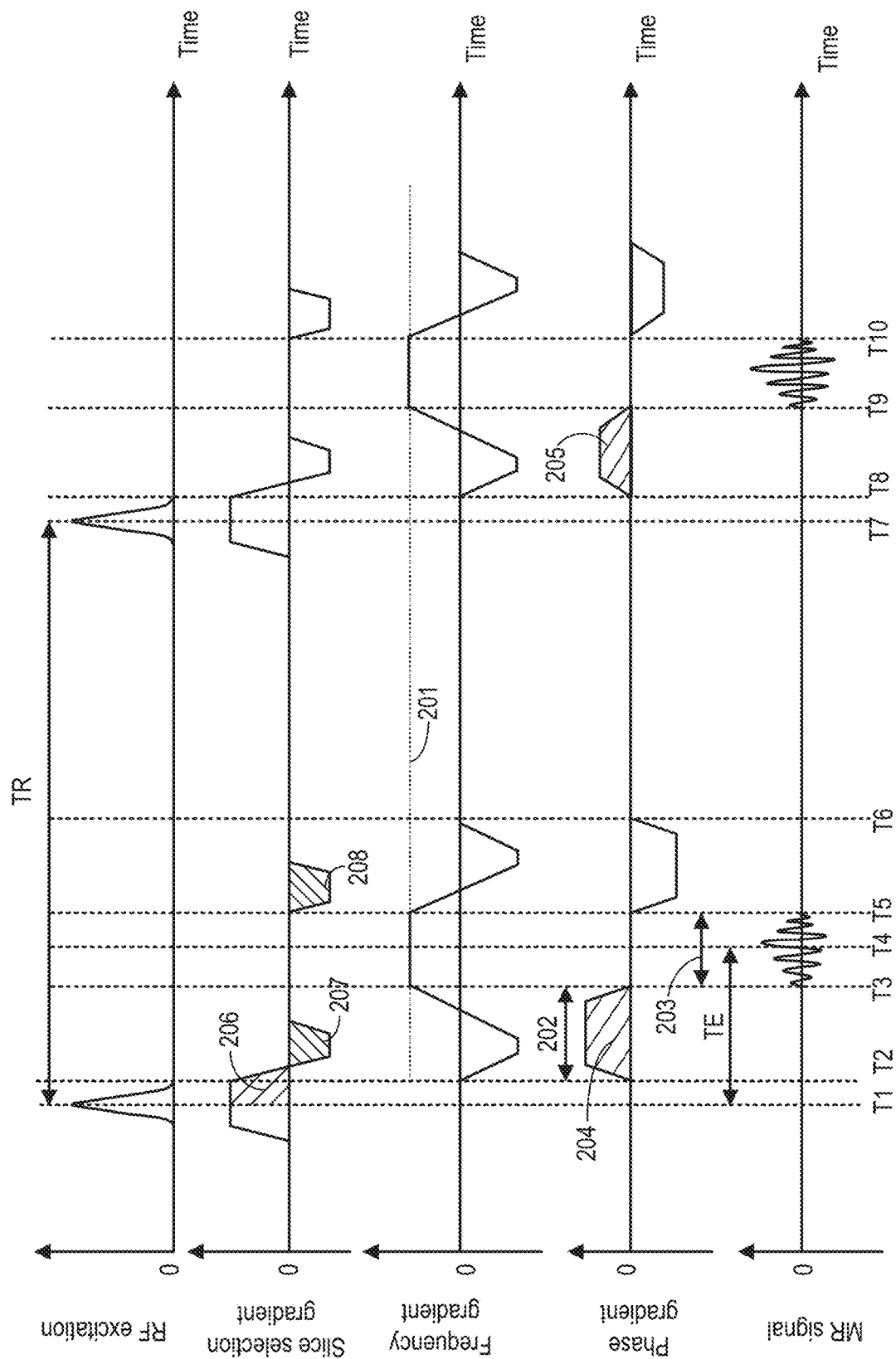
FIG. 2 shows an example pulse sequence for sampling a rectangular Cartesian k-space.

The following description relates to various embodiments for acquiring k-space data in a magnetic resonance imaging (MRI) system, such as the MRI apparatus depicted in FIG. 1. During MRI, the radio frequency (RF) excitations, the slice selection gradient, the phase encoding gradient, and the frequency encoding gradient are applied to an image subject according to a predetermined pulse sequence. The pulse sequence determines how the k-space is sampled. FIG. 2 shows an example pulse sequence for acquiring k-space data in a rectangular Cartesian k-space, such as the rectangular Cartesian k-space of FIG. 3. In order to increase the imaging speed and reduce the artifacts such as the banding artifacts and the motion artifacts, short repetition time (TR) between the RF excitations is desired. However, the minimal TR may be limited by one or more factors including the power of the RF coil, the power of the gradient coil, the heating of the RF coil, and the pulse sequence length after each RF pulse. In some pulse sequences (e.g., balanced steady-state gradient echo sequence), the minimal TR may primarily be limited by the power load of the gradient coils, especially the power load of the phase gradient coil. One way to decrease the TR is to reduce data acquisition time and/or phase encoding steps, which may, however, reduce the image resolution.

Figure 6A:
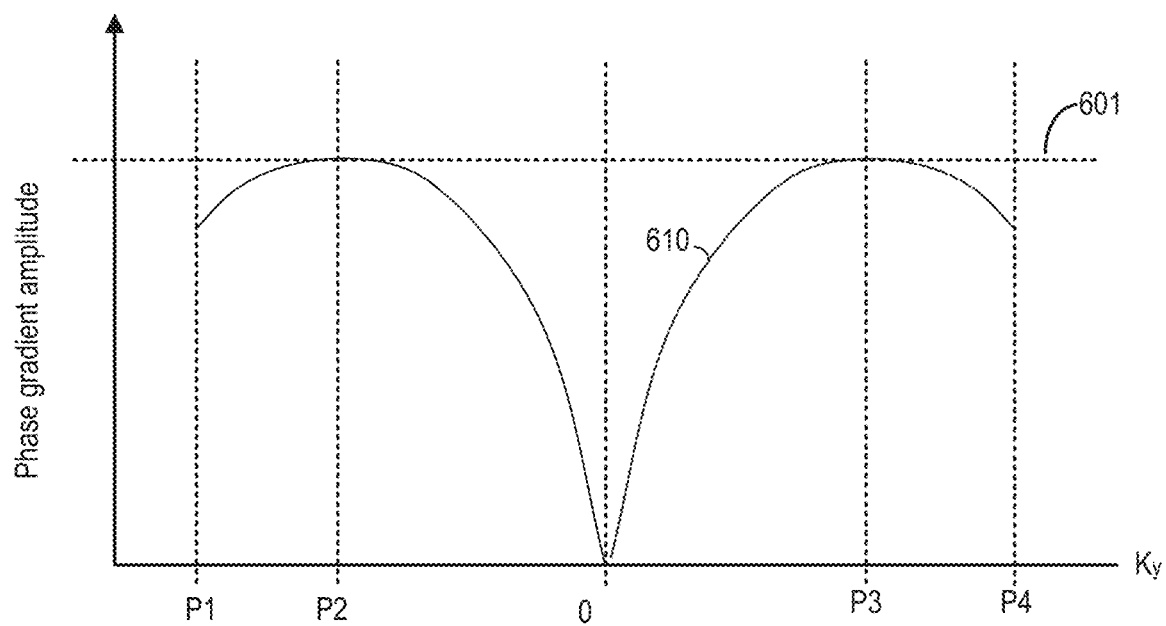
FIG. 6A shows the amplitude of phase encoding gradient at different phase angles in the pulse sequence of FIG. 4.
Figure 6B:
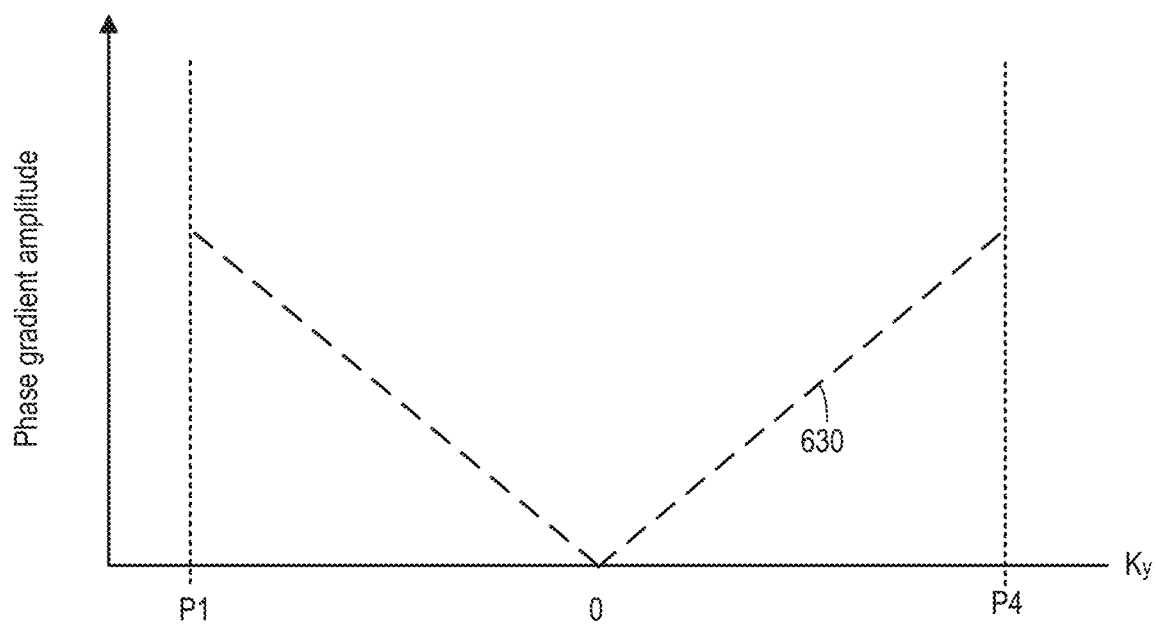
FIG. 6B shows the amplitude of phase encoding gradient at different phase angles in the pulse sequence of FIG. 2.
Figure 7:
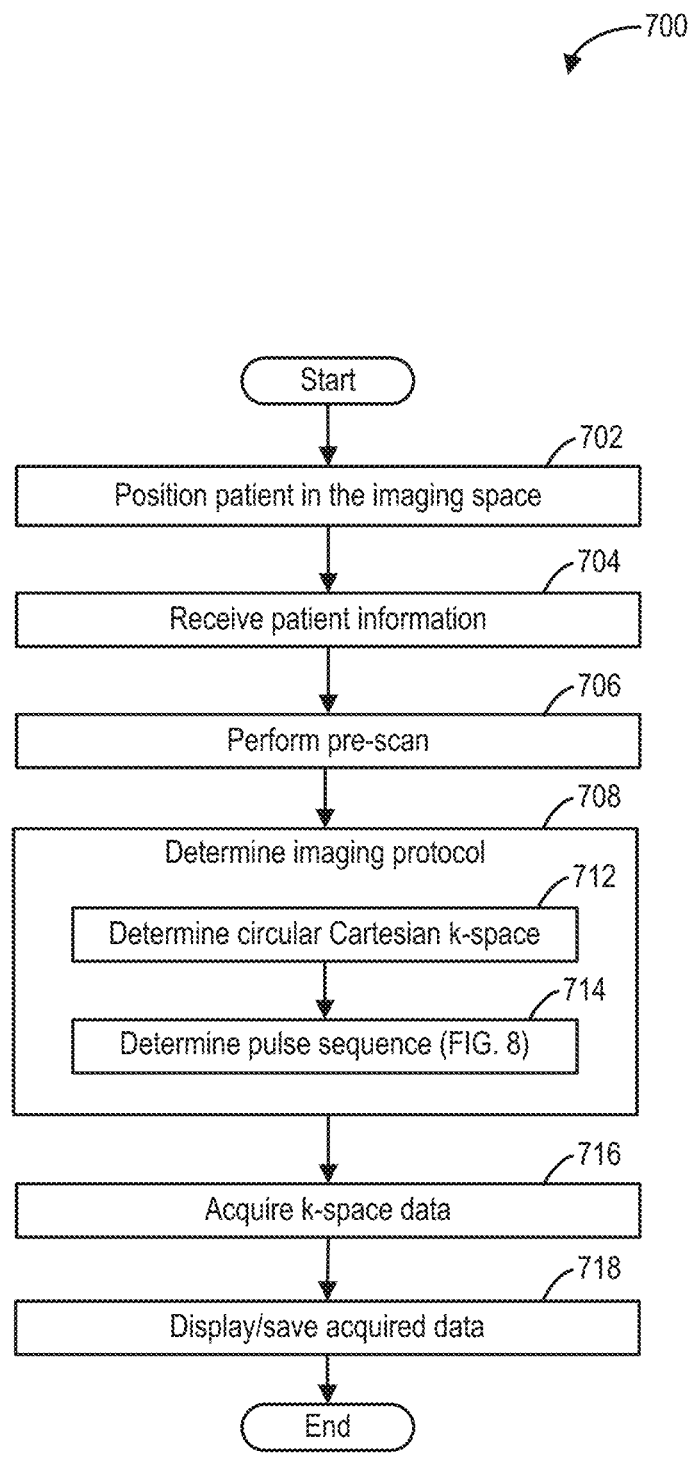
FIG. 7 shows a flow chart of an example method for sampling a circular Cartesian k-space.
Figure 8:
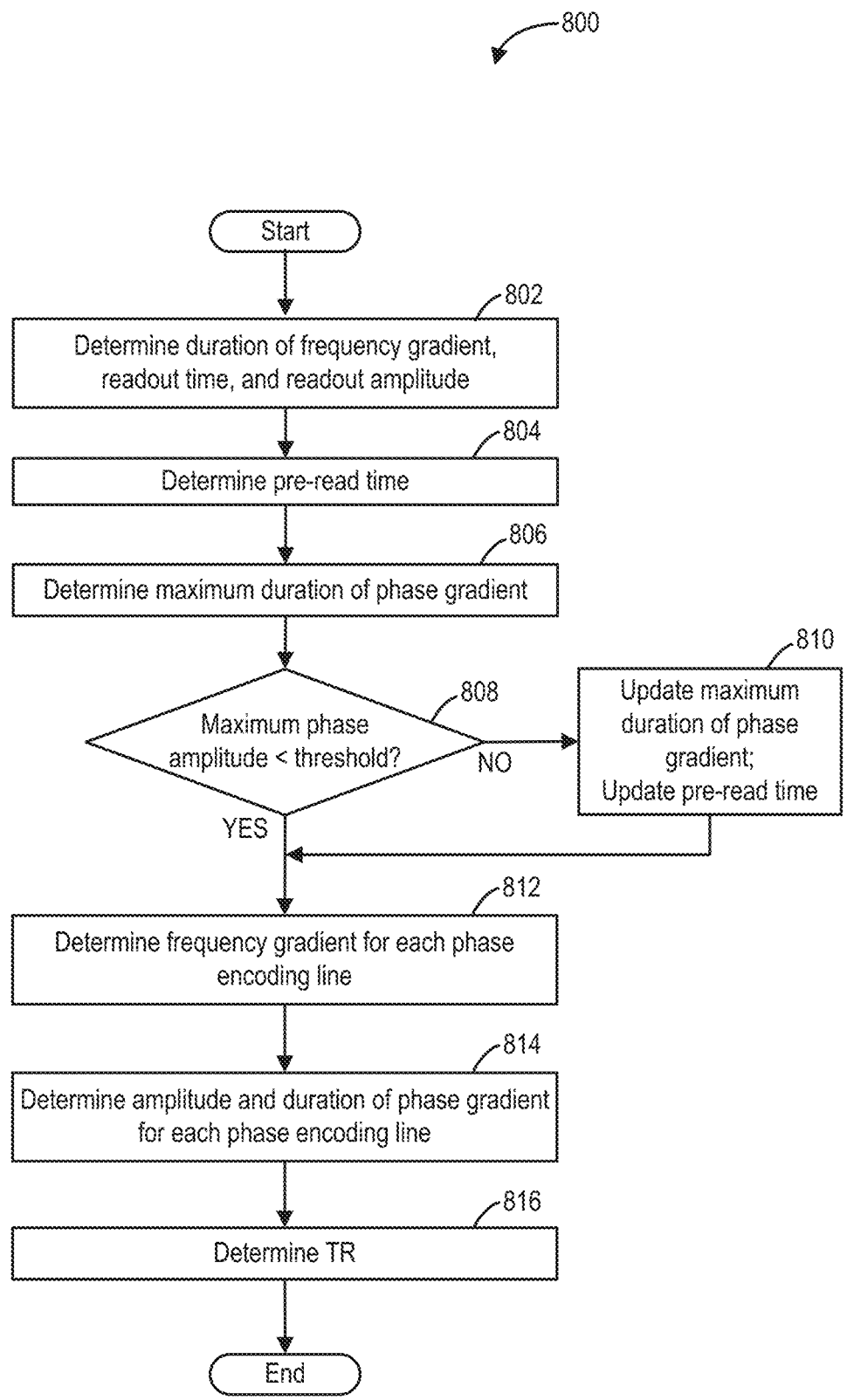
FIG. 8 shows a flow chart of an example method for determining the pulse sequence.
Figures 9A, 9B:
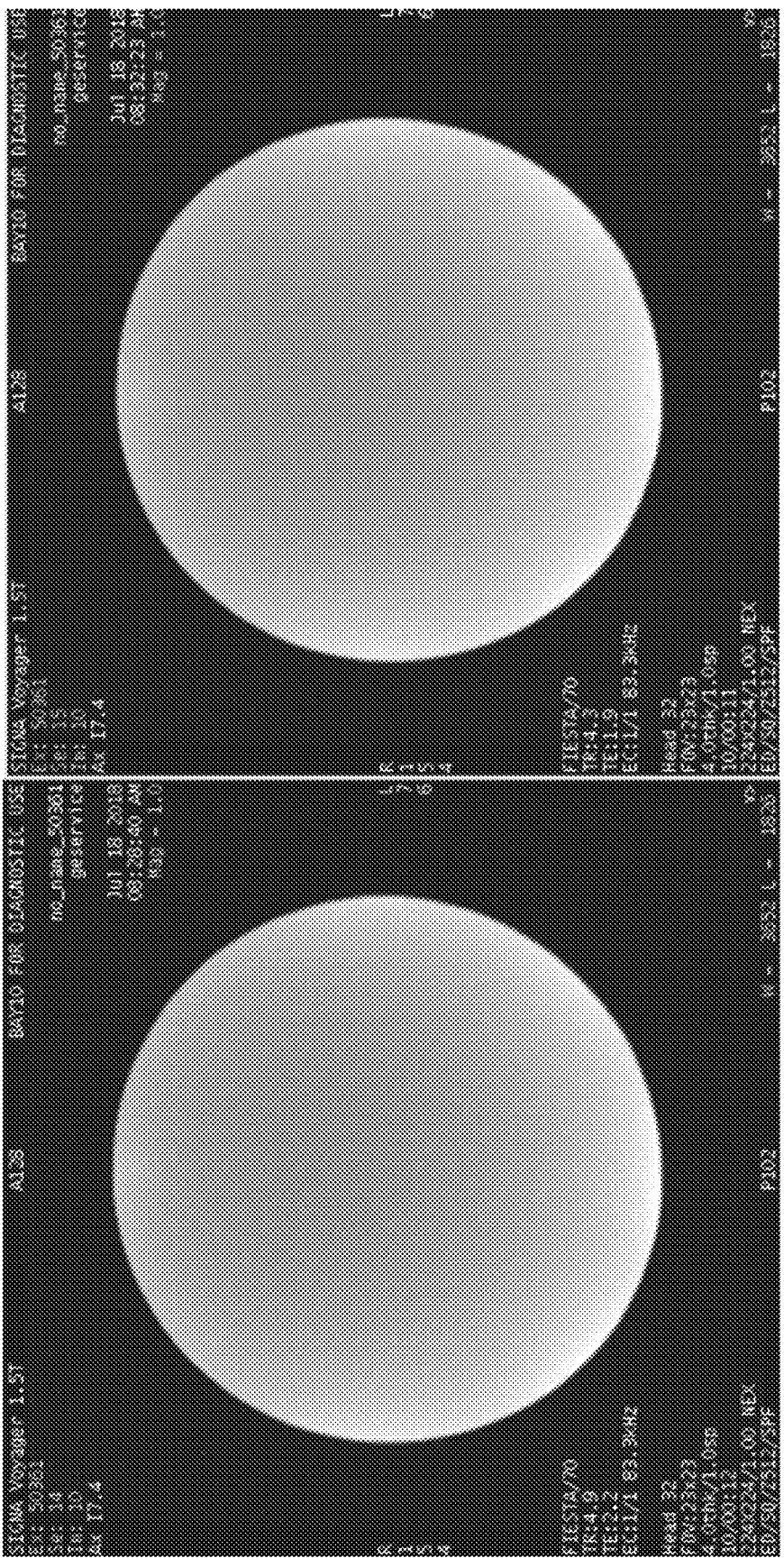
FIG. 9A is an MRI image acquired with the pulse sequence of FIG. 2.
FIG. 9B is an MRI image acquired with the pulse sequence of FIG. 4.

Herein, a method for acquiring k-space data with reduced TR and low gradient coil power consumption rate is introduced. The method includes sampling a circular Cartesian k-space shown in FIG. 5A with pulse sequences shown in FIG. 4. FIG. 5B shows an example Fermi filter to generate the circular Cartesian k-space of FIG. 5A. FIGS. 6A and 6B show the distribution of the phase gradient amplitudes in the pulse sequence of FIG. 4 and FIG. 2, respectively. FIG. 7 is an example method for performing MRI imaging by sampling the circular Cartesian k-space with the pulse sequences shown in FIG. 4. FIG. 8 is a subroutine for determining the pulse sequences of FIG. 4. FIG. 9A and FIG. 9B are MRI images reconstructed from data acquired with pulse sequences of FIG. 2 and FIG. 4, respectively.

FIG. 1 illustrates a magnetic resonance imaging (MRI) apparatus 10 that includes a magnetostatic field magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are separate but electromagnetically coupled components. The MRI apparatus 10 transmits electromagnetic pulse signals to the subject 16 placed in an imaging space 18 with a static magnetic field formed to perform a scan for obtaining magnetic resonance signals from the subject 16. One or more images of the subject 16 can be reconstructed based on the magnetic resonance signals thus obtained by the scan.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field $B_0$ is formed by the magnetostatic field magnet unit 12, the RF coil unit 15 transmits, based on a control signal from the controller unit 25, an RF pulse that is an electromagnet wave to the subject 16 and thereby generates a high-frequency magnetic field $B_1$. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

The RF body coil unit 15 is disposed, for example, to enclose the imaging space 18, and produces RF magnetic field pulses orthogonal to the main magnetic field $B_0$ produced by the magnetostatic field magnet unit 12 within the imaging space 18 to excite the nuclei. In contrast to the RF coil unit 14, which may be disconnected from the MRI apparatus 10 and replaced with another RF coil unit, the RF body coil unit 15 is fixedly attached and connected to the MRI apparatus 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a two-dimensional (2D) slice image or three-dimensional (3D) image of the subject 16 generated by the data processing unit 31.

Figure 3:
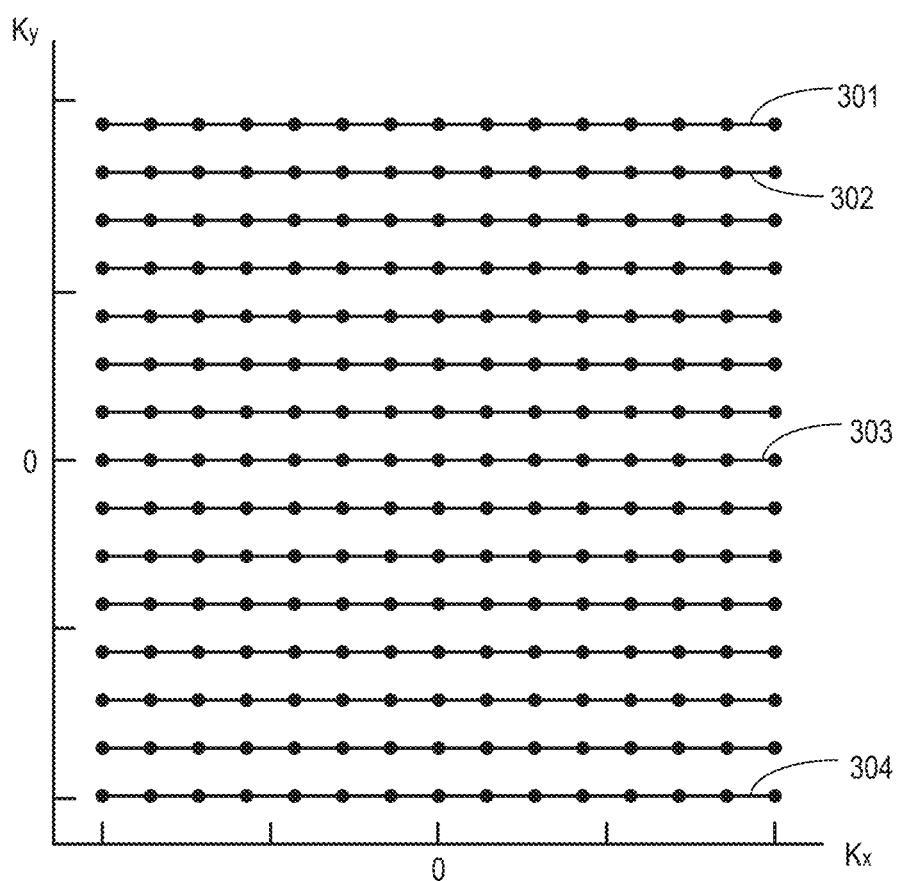
FIG. 3 shows an example rectangular Cartesian k-space.

FIG. 2 shows an example pulse sequence for sampling a rectangular k-space shown in FIG. 3. In FIG. 2, the x-axes are time, and the time increases as indicated by the arrow. The first plot is the RF excitation. The duration between adjacent RF excitation pulses is TR. The second plot is the slice selection gradient, which determines the plane perpendicular to $B_0$ that is going to be imaged. The third and the fourth plots show the frequency encoding gradient field and the phase encoding gradient field applied to the image subject, respectively. By applying the frequency and phase encoding gradients, data points along a phase encoding line in the k-space may be filled by sampling one echo of the echo train. The amplitudes of the frequency and phase encoding gradients may be positive or negative. The fifth plot is the sampled echo signal (that is, MR signal). The duration between the center of the echo and its corresponding RF excitation pulse is the echo time (TE).

FIG. 3 shows phase encoding lines in a rectangular Cartesian k-space. The Kx-axis is the frequency encoding axis, and the Ky-axis is the phase encoding axis. Phase encoding lines (such as phase encoding lines 301 and 302) are equally spaced and parallel to the Kx-axis. Each phase encoding line corresponds to a phase angle. Solid dots along each of the phase encoding line indicate the sampled data points. The phase encoding lines 301 and 304 have the highest absolute phase angle. The phase encoding line 303 has zero phase angle. The k-space in FIG. 3 is in rectangular shape. That is, each phase encoding line is of the same length. In other words, each phase encoding line spans the same range along the frequency encoding axis.

Referring back to FIG. 2, at T1, a RF excitation pulse is sent while the slice selection gradient is being applied. The slice selection gradient may include both positive and negative components. The center of the RF excitation pulse may align with the center of the positive portion of the slice selection gradient.

At T2, the phase encoding gradient starts to ramp from zero phase angle to a desired phase encoding gradient amplitude, then decreases from the desired phase gradient amplitude to zero at T3. The duration 202 of the phase encoding gradient is from T2 to T3. In one example, the ramping from zero phase angle to the desired phase gradient amplitude and the decreasing from the desired phase gradient amplitude to zero may be omitted, and the phase gradient may have a top hat profile. Herein, the desired phase gradient amplitude is also referred to as the phase encoding gradient amplitude. The area 204 under the phase gradient is proportional to the absolute value of the phase angle of the phase encoding line in the Cartesian k-space. Therefore, when applying a phase encoding gradient to fill the phase encoding lines 301 and 304, the area under the phase gradient is the largest. Phase encoding gradient with minimum area under the phase gradient is applied for acquiring the phase encoding line 303. In one example, no phase encoding gradient is applied for acquiring the phase encoding line 303 (that is, zero area under the phase gradient).

At T3, the phase encoding gradient reaches zero, and the frequency encoding gradient reaches the readout amplitude 201. The frequency encoding gradient is kept at the readout amplitude 201 during the entirety of the readout time 203 from T3 to T5. During the readout time, one phase encoding line (such as the phase encoding line 301 of FIG. 3) is filled by sampling the echo signal (MR signal). The MR signal is sampled during the entirety of the read out time, and all of the sampled data points during the readout time are mapped to the corresponding phase encoding line in the k-space. The sampled data points have the same phase angle. The duration from sending the RF excitation pulse to the start of readout time (from T1 to T3) is referred as the pre-read time. The duration from sending the RF excitation pulse to the middle of the readout time is the echo time (TE).

At T5, after sampling all data points along the phase encoding line, the frequency encoding gradient starts decreasing from the readout amplitude 201. A negative slice selection gradient is also applied. The area 208 of the negative slice selection gradient is the same as the area 207 of the negative portion of the slice selection gradient, and area 206, which is half the area of the positive portion of the slice selection gradient. A rewinder phase encoding gradient, which is opposite to the phase encoding gradient between T2 and T3 is applied between T5 and T6. The rewinder phase gradient may be of the same duration but opposite phase (or opposite amplitude) from the phase gradient between T2 and T3.

At T7, a second RF excitation pulse is sent while a second slice selection gradient is being applied. The second slice selection gradient may be identical to the slice selection gradient at T1.

A phase encoding gradient is applied from T8 to T9. The duration from T8 to T9 may be the same as the duration from T2 to T3. In other words, the duration of the phase gradient is constant. The amplitude of the phase encoding gradient is lower than the amplitude of the phase encoding gradient between T2 and T3.

During readout time between T9 and T10, the second phase encoding line (such as phase encoding line 302 of FIG. 3) is filled. Since the area 205 under the phase gradient is smaller than area 204, the second phase encoding line has a phase angle smaller than the phase encoding line filled during readout time from T3 to T5. The readout time duration from T9 to T10 is the same as the readout time duration from T3 to T5. Thus, when sampling a rectangular Cartesian k-space, the readout time duration is constant, and does not change with the phase angle of the sampled phase encoding line.

At T10, sampling of the MR signal is completed. The negative slice selection gradient and the negative phase encoding gradient are applied.

In the pulse sequence shown in FIG. 2, the readout time does not change with the phase angle of the phase encoding line. The pre-read time (from T1 to T3) is determined primarily by the phase encoding gradient duration. The pre-read time increases with increased phase encoding gradient duration. The amplitude of the phase encoding gradient may be proportional to the absolute value of the phase angle of the sampled phase encoding line, as shown in FIG. 6B. The minimal phase encoding gradient duration is limited by the phase gradient power. In other words, the phase encoding gradient duration may not be further reduced since the maximum amplitude of the phase gradient should not exceed a threshold determined by the phase gradient power.

Figure 4:
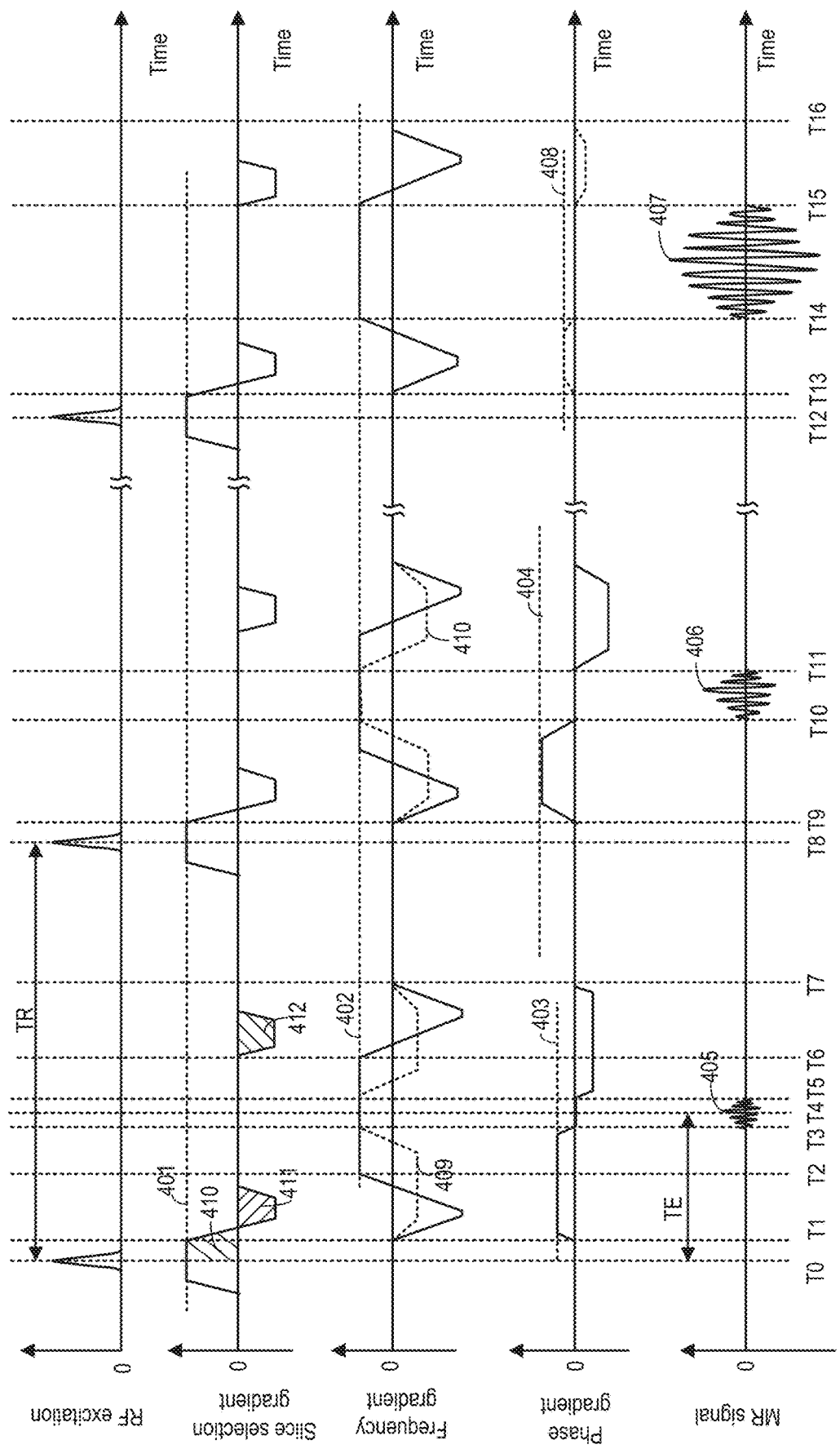
FIG. 4 shows an example pulse sequences for sampling a circular Cartesian k-space.
Figure 5A:
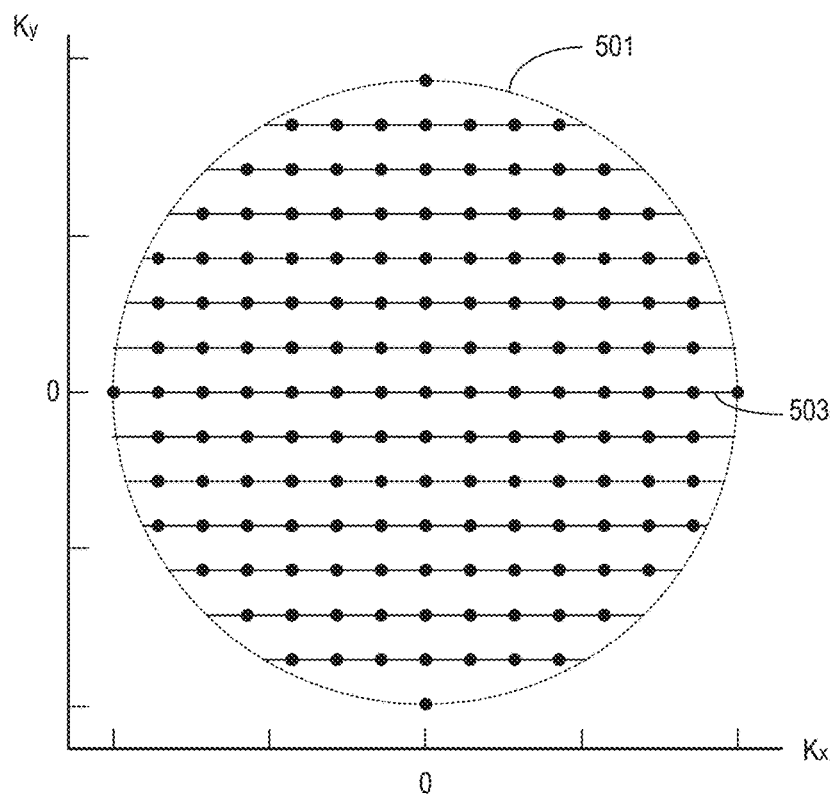
FIG. 5A shows an example circular Cartesian k-space.
Figure 5B:
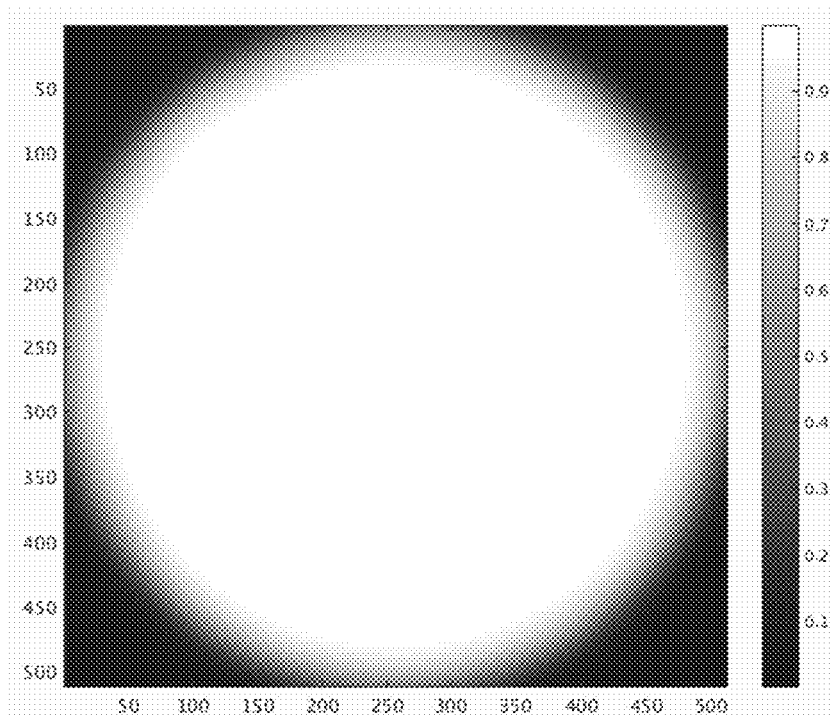
FIG. 5B shows an example Fermi filter for determining the circular Cartesian k-space of FIG. 5A.

FIG. 4 shows example pulse sequences for sampling a circular Cartesian k-space of FIG. 5A. The axes of each plot are the same as the pulse sequence shown in FIG. 2. In the pulse sequence of FIG. 4, the duration and/or amplitude of the phase encoding gradient, as well as the readout time, may vary based on the phase angle of the sampled phase encoding line.

FIG. 5A shows an example circular Cartesian k-space. The axes of FIG. 5A are the same as the axes of FIG. 3. The circular Cartesian k-space includes a plurality of phase encoding lines equally spaced along the phase encoding axis $K_y$. The plurality of phase encoding lines are parallel to the frequency encoding axis $K_x$. Each phase encoding line corresponds to a phase angle. The length of the phase encoding line varies based on the phase angle. The solid dots on the phase encoding lines indicate data points that are filled. All data points of the circular Cartesian k-space are enclosed by dashed line 501. The dashed line 501 is centered at the center of k-space (that is, $K_x=0$, and $K_y=0$). In one example, the dashed line 501 may be a circle. In another example, the dashed line 501 may be in elliptical shape. At a constant sampling dwell time, the duration of the readout time is proportional to the length of the phase encoding line. The readout duration is shortest at the highest absolute phase angle, and is the longest at the lowest absolute phase angle (such as zero phase angle). For example, the readout duration for phase encoding line 503 is the longest.

In one example, the circular Cartesian k-space may be determined by thresholding a Fermi filter. FIG. 5B shows an example Fermi filter. The amplitude of the filter is indicated in grayscale, with value of zero (0) in black, and value of one (1) in white. The x-axis and the y-axis are the indexes of data points along the frequency encoding axis $K_x$ and the phase encoding axis $K_y$. The Fermi filter amplitude w(x,y) at a data point (x,y) can be calculated with the following equations:

$$r(x, y) = \sqrt{\left(x - \frac{xsize}{2}\right)^2 + \left\{fermi_{ecc} \times \left(y - \frac{ysize}{2}\right)\right\}^2} \quad \text{Equation 1}$$

$$w(x, y) = \frac{1}{1 + \exp\left(\frac{r(x, y) - fermi_{radius}}{fermi_{width}}\right)} \quad \text{Equation 2}$$

wherein xsize is the size along the x-axis (or the number of the data points along the x-axis); ysize is the size along the y-axis (or the number of the data points along the y-axis); $fermi_{ecc}$ is a filter parameter; $fermi_{radius}$ is the radius of the filter; and $fermi_{width}$ is another filter parameter. Herein, xsize=ysize=512, and $fermi_{radius}$=xsize/2=256. The filter is circular when xsize equals ysize, and is elliptical when xsize and the ysize are different. The filter parameters $fermi_{ecc}$ and $fermi_{width}$ are set to be 1 and 10, respectively. A filter threshold for the amplitude of the filter may be set to obtain the circular Cartesian k-space. For example, the dashed line 501 may be determined to include all filter amplitude higher than the filter threshold.

Turning back of FIG. 4, at T0, similar to the pulse sequence of FIG. 2, a RF excitation pulse is sent while the slice selection gradient maintains at slice selection amplitude 401. The center of the RF excitation pulse aligns with the center of the positive portion of the slice selection gradient.

At T1, the phase encoding gradient starts to ramp from zero phase angle to a desired phase encoding gradient amplitude, then decreases from the desired phase gradient amplitude to zero at T3.

During the readout time from T3 to T5, the MR signal (echo 405) is sampled and mapped to a phase encoding line in the circular k-space. The duration of the readout time varies based on the phase angle of the phase encoding line. The duration from T0 to T4 (center of echo 405) is TE.

from T5 to T7, a rewinder phase encoding gradient may be applied. The rewinder phase encoding gradient is opposite to the phase gradient from T1 to T3. That is, the rewinder phase gradient has the same absolute amplitude and opposite sign from the phase gradient from T1 and T3.

At T6, responsive to frequency gradient decreasing from the readout amplitude 402, a negative slice selection gradient is applied. Similar to the slice selection gradient of FIG. 2, area 410, area 411, and area 412 are the same.

At T8, a RF excitation pulse is sent while the slice selection gradient is being applied. At T9, the phase encoding gradient starts to ramp to a second phase gradient amplitude 404 and maintains at the second phase gradient amplitude 404 for a duration, then decreases from the second phase gradient amplitude 404 to zero at T10. The second phase gradient amplitude 404 is higher than the phase gradient amplitude 403. The area under the second phase encoding gradient amplitude 404 may be lower than the area under the first phase gradient encoding amplitude 403 because the duration of 404 is shorter than the duration of 403. The duration from T0 to T8 is TR.

Responsive to the phase encoding gradient reaching zero at T10, the MR signal (second echo 406) is sampled during the readout time from T10 to T11. One phase encoding line is filled with the sampled data. The duration of the readout time for sampling the second echo 406 may be longer than the duration of the readout time for sampling the first echo 405. The phase encoding line filled by sampling the second echo 406 has a lower absolute phase angle comparing to the phase encoding line filled by sampling the first echo 405.

At T11, a rewinder phase gradient with reversed phase from the phase gradient from T9 to T10 is applied.

At T12, a RF excitation pulse is sent while the slice selection gradient is being applied. When the slice selection gradient starts decreasing at T13, the phase encoding gradient starts to ramp to a third phase gradient amplitude 408. The third phase gradient amplitude 408 may be lower than both the first phase gradient amplitude 403 and second phase gradient amplitude 404.

During the readout time from T14 to T15, the MR signal (third echo 407) is sampled. Comparing to the phase encoding lines filled by sampling the first echo 405 and second echo 406, the phase encoding line filled by sampling the third echo 407 has the smallest absolute phase angle (that is, closest to the k-space center). The duration of readout time (from T14 to T15) is the same as the duration when the frequency gradient is at the readout amplitude 402. From T15 to T16, after sampling echo 407, a rewinder phase gradient is applied.

In some embodiments, the readout amplitude 402 is the same for sampling each echo. The maximum duration of the readout time (such as from T14 to T15) is the duration for sampling the phase encoding line closest to the k-space center (that is, lowest phase angle). In one example, if the phase encoding line passes the center of k-space (such as phase encoding line 503 of FIG. 5A), the phase gradient and the rewind phase gradient from T13 to T14 and T15 to T16 (drawn in dashed lines) may not be applied.

In some embodiments, after each RF excitation, the sum of the duration of the phase encoding gradient (such as T1-T3), duration of the readout time (such as T3-T5), and the duration of the rewind phase encoding gradient (such as T5-T7) is the same as the duration of the frequency encoding gradient (such as from T1-T7). The duration of the frequency encoding gradient may be determined based on the duration of the maximum readout time (such as from T14-T15). In another example, after each RF excitation, the sum of the phase encoding gradient duration and half of the corresponding readout time duration equals half of the frequency gradient duration. In this way, both TR and TE may be reduced comparing to the TR and TE of FIG. 2, without sacrificing the image quality. Further, with larger absolute phase angle, the readout duration is reduced and the duration of the phase encoding gradient is increased. As such, the maximum amplitude of the phage encoding gradient may be reduced.

In some embodiments, the frequency encoding gradient is the same for sampling each phase encoding line. The duration of the frequency encoding gradient at the readout amplitude is the same for each phase encoding line. The readout time is a fraction of the frequency encoding gradient at the readout amplitude. That is, the echo may not be sampled during a fraction of the frequency gradient at the readout amplitude.

In some embodiments, the frequency encoding gradient varies based on the phase angle of the phase encoding line. For example, as illustrated in dashed line 409 and 410, the duration of the frequency encoding gradient at the readout level may be the same as the read out duration, varied based on the phase angle of the filled phase encoding line. For example, the duration that the frequency encoding gradient at the readout amplitude 402 is the same as the readout time from T3 to T5. By adjusting the frequency encoding gradient based on the phase angle of the corresponding phase encoding line, the total power supplied to the frequency encoding gradient coil may be reduced.

FIG. 6A shows the distribution of the phase encoding gradient amplitude 610 over the phase encoding axis $K_y$, in the pulse sequence of FIG. 4. The y-axis is the amplitude of the phase encoding gradient. The phase gradient encoding amplitude 610 increases as indicated by the arrow of the y-axis. The phase encoding gradient amplitude is symmetric to the center of k-space (zero phase angle). From zero phase angle to the phase angle P2 and from zero phase angle to the phase angle P3, the phase gradient amplitude increases monotonically from zero to the maximum phase gradient amplitude 601, then decreases monotonically from the maximum phase gradient amplitude 601 from phase angle P2 to phase angle P1 and from phase angle P3 to phase angle P4. The phase angles P3 and P4 have the maximum absolute value.

In some embodiments, when the radius of the circular Cartesian k-space and the readout amplitude are determined, the amplitude of the phase gradient may be calculated based on the phase angle and the duration of the frequency gradient. For example, the maximum phase gradient amplitude 601 may be determined by searching for a particular phase angle that maximize the phase gradient encoding amplitude. As the readout time depends on the phase angle, the duration of the phase encoding gradient is determined based on the readout duration and thus the phase angle.

In another example, parameters including one or more of the duration of the phase encoding gradient and the duration of the frequency encoding gradient are selected so that the total power load of the gradient coils does not exceed the power load limit.

FIG. 6B shows the phase gradient amplitude distribution in the pulse sequence for sampling a rectangular Cartesian k-space (such as the pulse sequence of FIG. 2). The phase gradient amplitude 630 increases linearly from zero phase angle to the maximum absolute phase angles P1 and P4.

At a particular phase angle, the area under the phase gradient is the same for the pulse sequences of FIG. 2 and FIG. 4. As the phase gradient amplitude in FIG. 6A is nonlinear, the phase gradient duration is nonlinear with respect to the phase angle. The phase gradient duration in the pulse sequence of FIG. 2 is constant.

FIG. 7 shows an example method 700 for performing a scan using the MRI apparatus (such as the MRI apparatus 10 of FIG. 1). During the scan, a circular Cartesian k-space is sampled by using the pulse sequence of FIG. 4. The sampled k-space data is then mapped to the image space to obtain the MRI image.

At 702, responsive to operator's instruction, the table (such as table 26 of FIG. 1) is moved to position the subject (such as a patient) in the imaging space (such as imaging space 18 of FIG. 1).

At 704, the operator input regarding the patient information is received. The patient information may include the anatomy that is going to be scanned and the field of view (FOV), among others.

At 706, a pre-scan of the subject may be performed. The pre-scan may be a lower resolution scan. In one example, the pre-scan may be performed in the FOV determined at 704. In another example, the field of view of the pre-scan may be larger than the FOV determined at 704. The FOV may be further adjusted based on the pre-scan.

At 708, the imaging protocol for a higher resolution scan is determined. In one example, the imaging protocol may be determined based on the received patient information and the FOV. Determining the imaging protocol may include determining the circular Cartesian k-space at 712, and determining the pulse sequence at 714. In another example, the imaging protocol may be selected from a plurality of protocols stored in the controller. For example, based on the received patient information and FOV, the MRI apparatus may display the plurality of imaging protocols to the operator. The operator may then select a protocol and adjust the imaging parameters within the selected protocol.

At 712, the circular Cartesian k-space (such as the circular Cartesian k-space of FIG. 5A) is determined. Determining the circular Cartesian k-space may include determining the size of the circular Cartesian k-space (such as the dashed line 501) within which the k-space data is sampled. In one example, the size may be determined based on the resolution of the image. For example, the size (number of data points) may increase with increased image resolution. In one example, the circular Cartesian k-space may be determined with a Fermi filter shown in FIG. 5B based on the Equations 1 and 2. Determining the size of the Fermi filter may include determining the xsize and ysize in Equations 1 and 2.

Determining the circular Cartesian k-space may further include determining the spacing of data points in the frequency encoding axis and the phase encoding axis. The spacing of the data points may be determined based on the FOV. For example, spacing between the data points in the k-space decreases with increased FOV.

At 714, the pulse sequence for sampling the circular Cartesian k-space of 712 is determined.

At 716, a higher resolution scan is performed by sampling the circular Cartesian k-space using the imaging protocol determined at 708.

At 718, image of the subject may be generated by reconstructing the acquired k-space data. The acquired data and/or the image may be stored in the memory of the imaging apparatus.

FIG. 8 shows an example method 800 for determining the pulse sequence (such as the pulse sequence of FIG. 4) for sampling the circular Cartesian k-space. In particular, the duration and amplitude of the phase encoding gradient may vary with the phase angle of the phase encoding line.

At 802, the readout time for each phase encoding line, the duration of the frequency encoding gradient, and the readout amplitude are determined. In one example, the readout time may be determined based on the phase angle of the phase encoding line, the size of the circular Cartesian k-space, and the dwelt time. The frequency gradient duration may be determined based on the maximum readout time, that is, the readout time for sampling the phase encoding line of the lowest phase angle. The readout amplitude may be determined based on the FOV and the bandwidth of the image apparatus for receiving the MR signal.

At 804, the pre-read time may be determined. The pre-read time is the duration between sending the RF excitation pulse and sampling the echo. For example, in FIG. 4, the pre-read time is the duration from T0 to T3. The pre-read time may be determined based on the duration of the slice selection gradient. The slice selection gradient may be determined based on the thickness of the slice and the signal to noise ratio of the image.

At 806, the maximum duration of the phase encoding gradient is determined. The maximum duration of the phase gradient may be determined based on the duration of the frequency gradient. For example, the maximum phase gradient duration may be half of the frequency gradient duration.

At 808, the maximum phase amplitude is calculated and is compared with a threshold amplitude. The threshold amplitude is determined based on the maximum phase gradient power. The maximum phase amplitude may be determined based on Equations 3 and 4. For example, based on the frequency gradient duration, the radius of the circular Cartesian k-space, and the readout amplitude, the first phase angle that has the maximum phase amplitude may be calculated. If the maximum phase amplitude is lower than the threshold amplitude, the duration of the frequency gradient for each phase encoding line is determined at 812. Otherwise, the maximum duration of the phase gradient and the pre-read time are updated at 810.

At 810, the maximum duration of the phase gradient is updated. The maximum duration of the phase gradient is increased so that the maximum phase amplitude is not higher than the threshold amplitude. In some embodiments, the maximum phase gradient amplitude is set to be the threshold amplitude, and the maximum phase gradient duration is then determined based on the threshold amplitude. Further, the pre-read time may also be increased based on the updated maximum phase gradient duration.

At 812, the frequency encoding gradients for sampling each phase encoding line of the circular k-space are determined based on the readout time determined at 802. In some embodiments, the duration of the frequency encoding gradient at the readout amplitude may be the same for sampling each phase encoding line. The duration of the frequency encoding gradient at the readout amplitude is the maximum readout time determined at 802, and the amplitude of the frequency encoding gradient is the readout amplitude determined at 802. In some embodiments, the duration of the frequency encoding gradient at the readout amplitude varies based on the phase angle of the phase encoding line. The duration of the frequency gradient at the readout amplitude is the same as the duration of the readout time.

At 814, the amplitude and the duration of the phase encoding gradient for each phase encoding line are determined. The duration of the phase gradient can be calculated based on the maximum phase gradient duration and the readout time. In one example, the duration of the phase encoding gradient may be calculated by subtracting half of the readout time from the maximum phase encoding gradient duration. The amplitude of the phase encoding gradient may be calculated based on the duration of the phase gradient. For example, the product of the amplitude and the duration of the phase gradient is proportional to the phase angle of the phase encoding line.

At 816, the TR may be determined based on the pre-read time and the duration of the frequency gradient. The TR may further be limited by the power limit of the radio frequency coil and the frequency gradient coil. In this way, amplitude of the phase encoding line may be minimized to reduce power supplied to the phase gradient coil. By limiting the power supply to the phase gradient coil, TR may be reduced.

FIGS. 9A and 9B show MRI images of a phantom obtained using the rectangular and the circular Cartesian k-space, respectively. FIG. 9A is acquired using the pulse sequence of FIG. 2, and FIG. 9B is acquired using the pulse sequence of FIG. 4. The image quality is the same, but the TR is reduced from 4.9 ms in FIG. 9A to 4.3 ms in FIG. 9B, and the TE is reduced from 2.2 ms in FIG. 9A to 1.0 ms in FIG. 9B.

The technical effect of sampling the circular Cartesian k-space instead of the rectangular Cartesian k-space is that the total power of the coils may be reduced without affecting image quality. Further, the phase gradient amplitude may be reduced to reduce the power supply to the phase gradient and reduce the TR and TE.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance imaging (MRI), comprising:
    applying a phase encoding gradient corresponding to a phase encoding line in a circular Cartesian k-space, wherein an amplitude and a duration of the phase encoding gradient vary with a position of the phase encoding line in the circular Cartesian k-space; and
    acquiring k-space data along the phase encoding line in the circular Cartesian k-space by applying a frequency encoding gradient, wherein a duration of the acquiring k-space data varies with the position of the phase encoding line in the k-space.

2. The method of claim 1, wherein the closer the phase encoding line is to the center of the k-space, the longer the duration of the acquiring k-space data, and the further the phase encoding line is from the center of the k-space, the shorter the duration of the acquiring k-space data.

3. The method of claim 1, wherein the closer the phase encoding line is to the center of the k-space, the shorter the duration of the phase encoding gradient, and the further the phase encoding line is from the center of the k-space, the longer the duration of the phase encoding gradient.

4. The method of claim 1, wherein the phase encoding line with the maximum amplitude of the phase encoding gradient is between the phase encoding line the closest to the center of the k-space and the phase encoding line the furthest from the center of the k-space.

5. The method of claim 1, wherein the duration of the frequency encoding gradient does not change with the phase encoding line, and the duration of acquiring the k-space data is a portion of the duration of the frequency encoding gradient.

6. The method of claim 5, wherein the duration of the frequency encoding gradient overlaps with the duration of the phase encoding gradient.

7. The method of claim 1, wherein the duration of the frequency encoding gradient varies with the position of the phase encoding line in the k-space.

8. A magnetic resonance imaging (MRI) apparatus, comprising:
    a frequency gradient coil;
    a phase gradient coil;
    a controller unit coupled to the frequency gradient coil and the phase gradient coil; and
    a memory storing executable instructions that, when executed, cause the controller unit to:
    apply a phase encoding gradient corresponding to a phase encoding line in a circular Cartesian k-space via the phase gradient coil, wherein an amplitude and a duration of the phase encoding gradient vary with a position of the phase encoding line in the circular Cartesian k-space; and
    acquire k-space data along the phase encoding line in the circular Cartesian k-space by applying a frequency encoding gradient via the frequency gradient coil, wherein a duration of the acquiring k-space data varies with the position of the phase encoding line in the k-space.

9. The MRI apparatus of claim 8, wherein the closer the phase encoding line is to the center of the k-space, the longer the duration of the acquiring k-space data, and the further the phase encoding line is from the center of the k-space, the shorter the duration of the acquiring k-space data.

10. The MRI apparatus of claim 8, wherein closer the phase encoding line is to the center of the k-space, the shorter the duration of the phase encoding gradient, and the further the phase encoding line is from the center of the k-space, the longer the duration of the phase encoding gradient.

11. The MRI apparatus of claim 8, wherein the phase encoding line with the maximum amplitude of the phase encoding gradient is between the phase encoding line the closest to the center of the k-space and the phase encoding line the furthest to the center of the k-space.

12. The MRI apparatus of claim 8, wherein the duration of the frequency encoding gradient does not change with the phase encoding line, and the duration of acquiring the k-space data is a portion of the duration of the frequency encoding gradient.

13. The MRI apparatus of claim 12, wherein the duration of the frequency encoding gradient overlaps with the duration of the phase encoding gradient.

14. The MRI apparatus of claim 1, wherein the duration of the frequency encoding gradient varies with the position of the phase encoding line in the k-space.

15. A non-transitory computer-readable medium comprising instructions that, when executed, cause a processor to:
    apply a phase encoding gradient corresponding to a phase encoding line in a circular Cartesian k-space, wherein an amplitude and a duration of the phase encoding gradient vary with a position of the phase encoding line in the circular Cartesian k-space; and
    acquire k-space data along the phase encoding line in the circular Cartesian k-space by applying a frequency encoding gradient, wherein a duration of the acquiring k-space data varies with the position of the phase encoding line in the k-space.

16. The computer-readable medium of claim 15, wherein the closer the phase encoding line is to the center of the k-space, the longer the duration of the acquiring k-space data, and the further the phase encoding line is from the center of the k-space, the shorter the duration of the acquiring k-space data.

17. The computer-readable medium of claim 15, wherein closer the phase encoding line is to the center of the k-space, the shorter the duration of the phase encoding gradient, and the further the phase encoding line is from the center of the k-space, the longer the duration of the phase encoding gradient.

18. The computer-readable medium of claim 15, wherein the phase encoding line with the maximum amplitude of the phase encoding gradient is between the phase encoding line the closest to the center of the k-space and the phase encoding line the furthest to the center of the k-space.

19. The computer-readable medium of claim 15, wherein the duration of the frequency encoding gradient does not change with the phase encoding line, and the duration of acquiring the k-space data is a portion of the duration of the frequency encoding gradient.

20. The computer-readable medium of claim 15, wherein the duration of the frequency encoding gradient overlaps with the duration of the phase encoding gradient.

* * * * *